US012812945B2

(12) United States Patent
Li et al.

(10) Patent No.: US 12,812,945 B2
(45) Date of Patent: Nov. 24, 2026

(54) SEMICONDUCTOR STRUCTURE AND MANUFACTURING METHOD THEREOF

(71) Applicant: Taiwan Semiconductor Manufacturing Company, Ltd., Hsinchu (TW)

(72) Inventors: Ming-Shuan Li, Hsinchu (TW); Chih-Chieh Yeh, Hsinchu (TW); Chih-Hung Wang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 372 days.

(21) Appl. No.: 18/651,224

(22) Filed: Apr. 30, 2024

(65) Prior Publication Data

US 2025/0338586 A1 Oct. 30, 2025

(51) Int. Cl.

| | |
|---|---|
| ***H10D 64/01*** | (2025.01) |
| ***H10D 30/01*** | (2025.01) |
| ***H10D 30/68*** | (2025.01) |
| ***H10D 62/10*** | (2025.01) |
| ***H10D 62/13*** | (2025.01) |
| ***H10W 10/00*** | (2026.01) |
| ***H10W 10/17*** | (2026.01) |

(52) U.S. Cl.

CPC ......... *H10D 64/017* (2025.01); *H10D 30/014* (2025.01); *H10D 30/6891* (2025.01); *H10D 62/121* (2025.01); *H10D 62/151* (2025.01); *H10D 64/018* (2025.01); *H10W 10/014* (2026.01); *H10W 10/17* (2026.01)

(58) Field of Classification Search

None

See application file for complete search history.

(56) References Cited

U.S. PATENT DOCUMENTS

| | | | | |
|---|---|---|---|---|
| 2012/0007051 | A1* | 1/2012 | Bangsaruntip | B82Y 10/00 977/762 |
| 2018/0175167 | A1* | 6/2018 | Reboh | B82Y 10/00 |
| 2020/0350215 | A1* | 11/2020 | Zhang | H10D 30/0243 |
| 2020/0411661 | A1* | 12/2020 | Guler | H10D 30/014 |
| 2021/0184032 | A1* | 6/2021 | Nidhi | H10D 30/014 |

* cited by examiner

*Primary Examiner* — Bilkis Jahan

(74) *Attorney, Agent, or Firm* — Birch, Stewart, Kolasch & Birch, LLP

(57) ABSTRACT

A semiconductor structure and a manufacturing method thereof are provided. The semiconductor structure includes a well, a plurality dummy elements, at least one source/drain diffusion region, at least one metal-to-diffusion (MD) layer and at least one metal gate (MG) layer. The plurality dummy elements are formed in or on a border area of the well. The at least one source/drain diffusion region is formed in the well and located at outside of the border area of the well. The at least one metal-to-diffusion layer is disposed on the source/drain diffusion region and located at outside of the border area of the well. The at least one metal gate layer is disposed adjacent to the metal-to-diffusion layer and located at outside of the border area of the well. The plurality of dummy elements are floating.

20 Claims, 8 Drawing Sheets

100

SEMICONDUCTOR STRUCTURE AND MANUFACTURING METHOD THEREOF

BACKGROUND

The disclosure relates in general to a semiconductor structure and a manufacturing method thereof, and more particularly to a high supply voltage semiconductor structure and a manufacturing method thereof.

Along with the semiconductor technology shrinkage, the device becomes smaller and smaller. The gate oxide and the side wall spacer are also become thinner and thinner. For reliability concern, the allowing supply voltage is limit in a low level. For example, the supply voltage must be lower than 0.75V in 2 nm or above technology.

However, there are still some application need to ensure high voltage input for the critical design.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
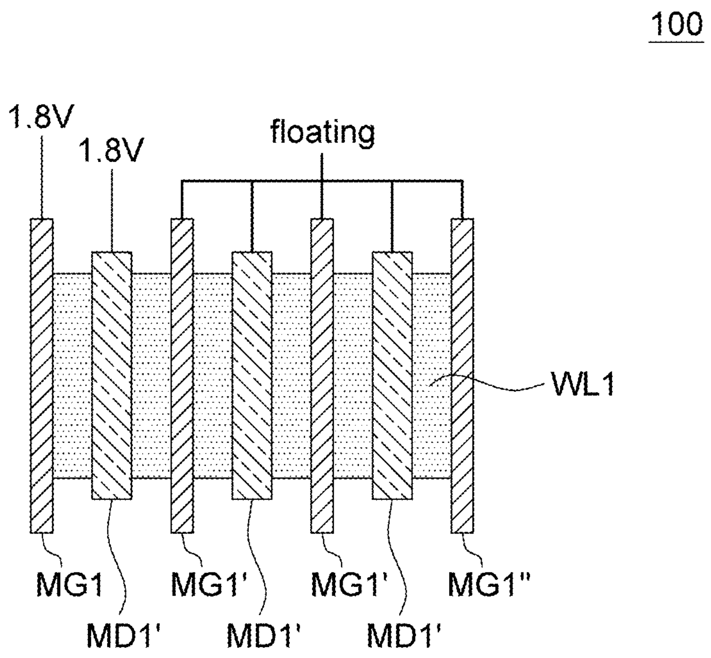
FIG. 1 shows a top view of a semiconductor structure according to one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The terms “comprise,” “comprising,” “include,” “including,” “has,” “having,” etc. used in this specification are open-ended and mean “comprises but not limited.” The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

Figure 2:
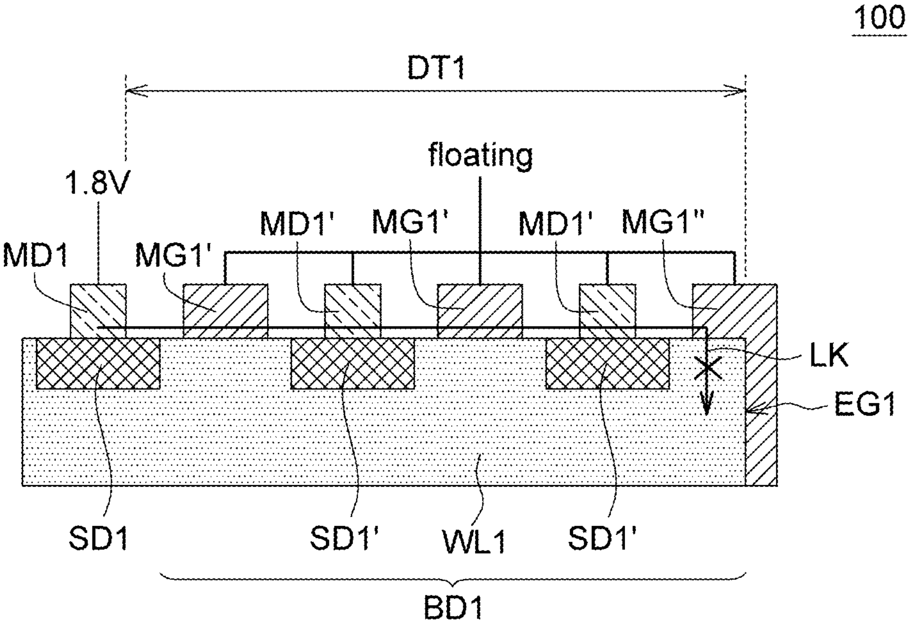
FIG. 2 shows a side view of the semiconductor structure according to one embodiment of the present disclosure.

Please refer to FIGS. 1 and 2. FIG. 1 shows a top view of a semiconductor structure 100 according to one embodiment of the present disclosure. FIG. 2 shows a side view of the semiconductor structure 100 according to one embodiment of the present disclosure. The semiconductor structure 100 includes, for example, a well WL1, an edge metal gate (MG) layer MG1", two dummy source/drain diffusion regions SD1' (shown in the FIG. 2), two dummy metal gate layers MG1', two dummy metal-to-diffusion (MD) layers MD1', at least one working source/drain diffusion region SD1 (shown in the FIG. 2), at least one working metal-to-diffusion layer MD1 and at least one working metal gate layer MG1 (shown in the FIG. 1).

The well WL1 may include the same semiconductor material(s) as the substrate. The well WL1 may be doped with p-type dopants, such as boron, indium, other p-type dopant, or combinations thereof, configured for the NMOS NMS. The well WL1 may be doped with n-type dopants, such as phosphorus, arsenic, other n-type dopant, or combinations thereof. In some implementations, the well WL1 is formed with a combination of p-type dopants and n-type dopants but with a net effect of being n-type doped. In some implementations, the well WL1 is formed with a combination of p-type dopants and n-type dopants but with a net effect of being p-type doped. The various doped regions can be formed directly on and/or in the substrate, by an ion implantation process, a diffusion process, and/or other suitable doping process. The dopant concentration in the well WL1 may be in a range of about 1E16 atom/cm^3 to about 1E19 atom/cm^3 in some embodiments, depending on well resistance requirements.

The edge metal gate layer MG1" is disposed at an edge EG1 of the well WL1. The material of the edge metal gate layer MG1" comprises single metal material or multiple metal layers. The material of the edge metal gate layer MG1" is Titanium (Ti), titanium nitride (TiN), Platinum (Pt), W (tungsten), Cobalt (Co), Ruthenium (Ru), Tungsten (W), Iridium (Ir), Rhodium (Rh), Tantalum nitride (TaN), Copper (Cu), the like, or the combination thereof.

The two dummy source/drain diffusion regions SD1' are formed in a border area BD1 of the well WL1. Each of the source/drain diffusion regions SD1' includes epi profile. For example, the epi material may be SiGe with Boron doped, SiGeC within Boron doped, Ge with Boron doped, Si with Boron doped, the like or the combination thereof. The Boron doping concentration of the source/drain diffusion regions SD1 is within a range of 1E19/cm^3 to 6E20/cm^3.

The two dummy metal gate layers MG1' are formed on the border area BD1 of the well WL1. The material of each of the dummy metal gate layers MG1' comprises single metal material or multiple metal layers. The material of the dummy metal gate layers MG1' is Titanium (Ti), titanium nitride (TiN), Platinum (Pt), W (tungsten), Cobalt (Co), Ruthenium (Ru), Tungsten (W), Iridium (Ir), Rhodium (Rh), Tantalum nitride (TaN), Copper (Cu), the like, or the combination thereof.

The two dummy metal-to-diffusion layers MD1' are respectively formed on the dummy source/drain diffusion regions SD1' and located on the border area BD1' of the well WL1. The material of each of the dummy metal-to-diffusion layers MD1' comprises single metal material or multiple metal layers. The material of the dummy metal-to-diffusion layers MD1' is Titanium (Ti), titanium nitride (TiN), Platinum (Pt), W (tungsten), Cobalt (Co), Ruthenium (Ru), Tungsten (W), Iridium (Ir), Rhodium (Rh), Tantalum nitride (TaN), Copper (Cu), the like, or the combination thereof.

The working source/drain diffusion region SD1 is formed in the well WL1 and located at outside of the border area BD1 of the well WL1. The working source/drain diffusion regions SD1 includes epi profile. For example, the epi material may be SiGe with Boron doped, SiGeC within Boron doped, Ge with Boron doped, Si with Boron doped, the like or the combination thereof. The Boron doping concentration of the source/drain diffusion regions SD1 is within a range of 1E19/cm^3 to 6E20/cm^3.

The working metal-to-diffusion layer MD1 is disposed on the working source/drain diffusion region SD1 and located at outside of the border area BD1 of the well WL1. The material of the working metal-to-diffusion layer MD1 comprises single metal material or multiple metal layers. The material of the working metal-to-diffusion layer MD1 is Titanium (Ti), titanium nitride (TiN), Platinum (Pt), W (tungsten), Cobalt (Co), Ruthenium (Ru), Tungsten (W), Iridium (Ir), Rhodium (Rh), Tantalum nitride (TaN), Copper (Cu), the like, or the combination thereof.

The working metal gate layer MG1 is disposed adjacent to the working metal-to-diffusion layer MD1 and located at outside of the border area BD1 of the well WL1. The material of the working metal gate layer MG1 comprises single metal material or multiple metal layers. The material of the working metal gate layer MG1 is Titanium (Ti), titanium nitride (TiN), Platinum (Pt), W (tungsten), Cobalt (Co), Ruthenium (Ru), Tungsten (W), Iridium (Ir), Rhodium (Rh), Tantalum nitride (TaN), Copper (Cu), the like, or the combination thereof.

The edge metal gate layer MG1", the two dummy metal gate layers MG1' and the two dummy metal-to-diffusion layers MD1' are floating.

In typical usage of 2 nm technology diode, the supply voltage applied on the working metal gate layer MG1 and the working metal-to-diffusion layer MD1 is 0.75 V. However, in the present embodiment shown in the FIGS. 1 and 2, the working metal gate layer MG1 and the working metal-to-diffusion layers MD1 could be applied 1.8 V. Because the 1.8 V signal is blocked by the dummy metal gate layers MG1' and the dummy metal-to-diffusion layers MD1' to the well WL1, high voltage, ex. 1.8 V, applied on the working metal gate layer MG1 and/or the working metal-to-diffusion layer MD1 will not cause a current leak LK.

As shown in the FIGS. 1 and 2, a distance DT1 between the metal-to-diffusion layer MD1 applied 1.8 V and the edge EG1 of the well WL1 is two contacted poly pitches (CPP). In one embodiment, the distance DT1 between the working metal-to-diffusion layer MD1 and the edge metal gate layer MG1" is, for example, larger than 86 nm.

The dummy metal-to-diffusion layers MD1' could be floating independently. Or, the dummy metal-to-diffusion layers MD1' could be connected together via inner routings. The edge metal gate layer MG1" and the dummy metal gate layers MG1' could be floating independently. Or, the edge metal gate layer MG1" and the dummy metal gate layers MG1' could be connected together via inner routings. Or, the dummy metal-to-diffusion layers MD1', the edge metal gate layer MG1" and the dummy metal gate layers MG1' could be connected together via inner routings.

The dummy metal-to-diffusion layers MD1', the edge metal gate layer MG1" and the dummy metal gate layers MG1' are formed in the border area BD1 in various ways. For example, one of the dummy metal-to-diffusion layers MD1' is disposed between the edge metal gate layer MG1" and one of the two dummy metal gate layers MG1', and another one of the dummy metal-to-diffusion layers MD1' is disposed between the two dummy metal gate layers MG1'.

Based on the embodiment shown in the FIGS. 1 and 2, the supply voltage could be higher than 0.75V in 2 nm or above technology. For example, even if the supply voltage is 1.8 V, the 1.8 V signal is blocked by the dummy metal gate layers MG1' and the dummy metal-to-diffusion layers MD1' to the well WL1, and the high voltage, ex. 1.8 V, applied on the working metal gate layer MG1 and/or the working metal-to-diffusion layer MD1 will not cause any current leak LK.

Figure 3:
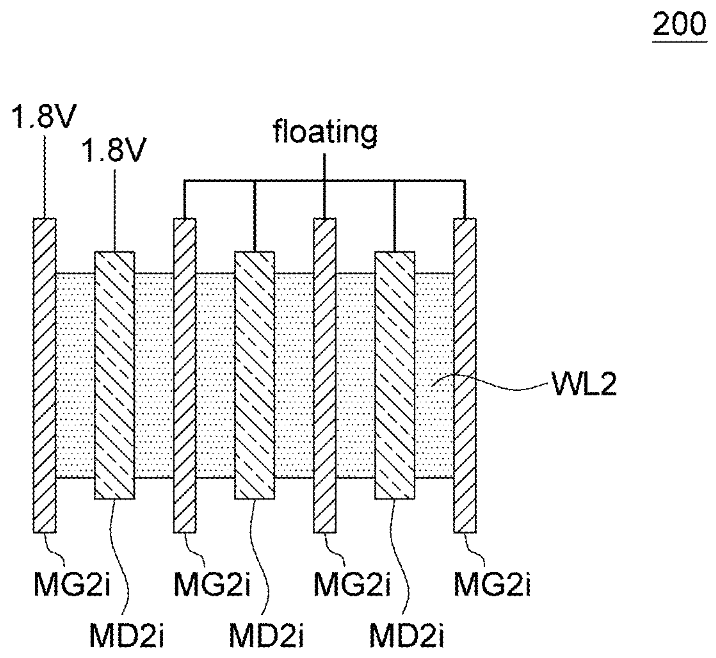
FIG. 3 shows a top view of a semiconductor structure according to another embodiment of the present disclosure.
Figure 4:
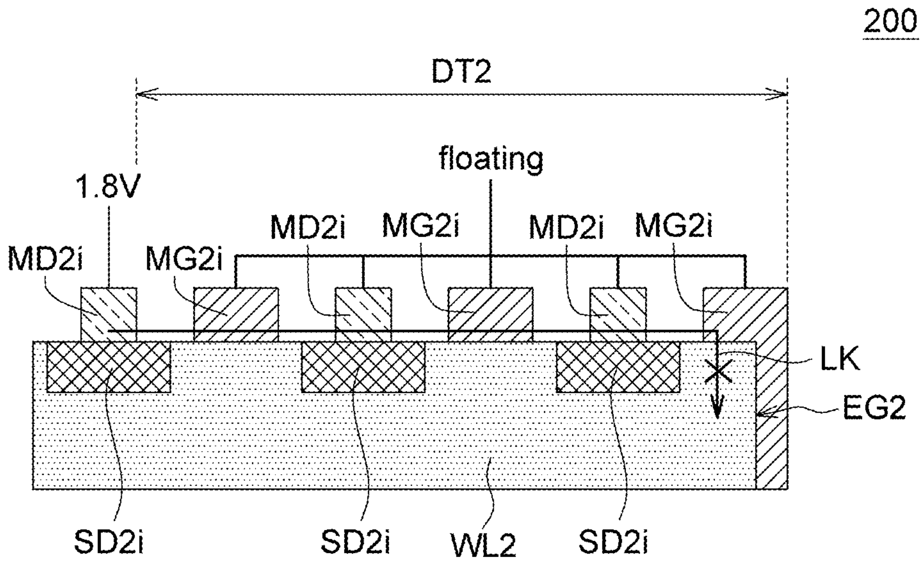
FIG. 4 shows a side view of the semiconductor structure according to one embodiment of the present disclosure.

Please refer to FIGS. 3 and 4. FIG. 3 shows a top view of a semiconductor structure 300 according to one embodiment of the present disclosure. FIG. 4 shows a side view of the semiconductor structure 200 according to one embodiment of the present disclosure. The semiconductor structure 200 includes, for example, a well WL2, a plurality of source/drain diffusion regions SD2*i*, a plurality of metal-to-diffusion layers MD2*i* and a plurality of metal gate layers MG2*i*.

The well WL2 may include the same semiconductor material(s) as the substrate. The well WL2 may be doped with p-type dopants, such as boron, indium, other p-type dopant, or combinations thereof, configured for the NMOS NMS. The well WL2 may be doped with n-type dopants, such as phosphorus, arsenic, other n-type dopant, or combinations thereof. In some implementations, the well WL2 is formed with a combination of p-type dopants and n-type dopants but with a net effect of being n-type doped. In some implementations, the well WL2 is formed with a combination of p-type dopants and n-type dopants but with a net effect of being p-type doped. The various doped regions can be formed directly on and/or in the substrate, by an ion implantation process, a diffusion process, and/or other suitable doping process. The dopant concentration in the well WL2 may be in a range of about 1E16 atom/cm^3 to about 1E19 atom/cm^3 in some embodiments, depending on well resistance requirements.

The source/drain diffusion regions SD2*i* are formed in the well WL2. Each of the source/drain diffusion regions SD2*i* includes epi profile. For example, the epi material may be SiGe with Boron doped, SiGeC within Boron doped, Ge with Boron doped, Si with Boron doped, the like or the combination thereof. The Boron doping concentration of the source/drain diffusion regions SD2$i$ is within a range of 1E19/cm^3 to 6E20/cm^3.

Each of the metal-to-diffusion layers MD2$i$ is disposed on one of the plurality of source/drain diffusion regions SD2$i$. The material of each of the metal-to-diffusion layers MD2$i$ comprises single metal material or multiple metal layers. The material of the metal-to-diffusion layers MD2$i$ is Titanium (Ti), titanium nitride (TiN), Platinum (Pt), W (tungsten), Cobalt (Co), Ruthenium (Ru), Tungsten (W), Iridium (Ir), Rhodium (Rh), Tantalum nitride (TaN), Copper (Cu), the like, or the combination thereof.

One of the plurality of metal gate layers MG2$i$ is disposed at an edge EG2 of the well WL2, each of the metal-to-diffusion layers MD2$i$ is disposed between two of the plurality of metal gate layers MG2$i$ which are adjacent. The material of the metal gate layers MG2$i$ comprises single metal material or multiple metal layers. The material of the metal gate layers MG2$i$ is Titanium (Ti), titanium nitride (TiN), Platinum (Pt), W (tungsten), Cobalt (Co), Ruthenium (Ru), Tungsten (W), Iridium (Ir), Rhodium (Rh), Tantalum nitride (TaN), Copper (Cu), the like, or the combination thereof.

Some of the metal gate layers MG2$i$ which are at or close to the edge EG2 of the well WL2 are floating, and some of the metal-to-diffusion layers MD2$i$ which are close to the edge EG2 of the well WL2 are floating. For example, three of the metal gate layers MG2$i$ which are at or close to the edge EG2 of the well WL2 are floating, and two of the metal-to-diffusion layers MD2$i$ which are close to the edge EG2 of the well WL2 are floating.

In typical usage of 2 nm technology diode, the supply voltage applied to the semiconductor structure 200 is 0.75 V. However, in the present embodiment shown in the FIGS. 3 and 4, the semiconductor structure 200 could be applied 1.8 V. Because the 1.8 V signal is blocked by two of the metal gate layers MG2$i$ and two of the metal-to-diffusion layers MD2$i$ to the well WL2, high voltage, ex. 1.8 V, applied on the semiconductor structure 200 will not cause any current leak LK.

As shown in the FIGS. 3 and 4, a distance DT2 between the metal-to-diffusion layer MD2$i$ applied 1.8 V and the edge EG2 of the well WL2 is two contacted poly pitches (CPP). In one embodiment, the distance DT2 between the metal-to-diffusion layer MD2$i$ applied 1.8 V and the edge EG2 of the well WL2 is larger than 86 nm.

The metal-to-diffusion layers MD2$i$ which are floating could be floating independently. Or, the metal-to-diffusion layers MD2$i$ which are floating are connected together via inner routings. The metal gate layer MG2$i$ which are floating could be floating independently. Or, the metal gate layer MG2$i$ which are floating could be connected together via inner routings. Or, the metal-to-diffusion layers MG2$i$ and the metal gate layer MG2$i$ which are floating could be connected together via inner routings.

The metal-to-diffusion layers MD2$i$ and the metal gate layers MG2$i$ which are floating could be formed in various ways. For example, each of the metal-to-diffusion layers MD2$i$ which is floating is disposed between the metal gate layers MG2$i$ which are floating.

Based on the embodiment shown in the FIGS. 3 and 4, the supply voltage could be higher than 0.75V in 2 nm or above technology. For example, even if the supply voltage is 1.8 V, the 1.8 V signal is blocked by the two metal gate layers MG2$i$ and the two metal-to-diffusion layers MD2$i$ to the well WL2, and the high voltage, ex. 1.8 V, applied on the working metal gate layer MG2 and/or the working metal-to-diffusion layer MD2 will not cause any current leak LK.

Figure 5:
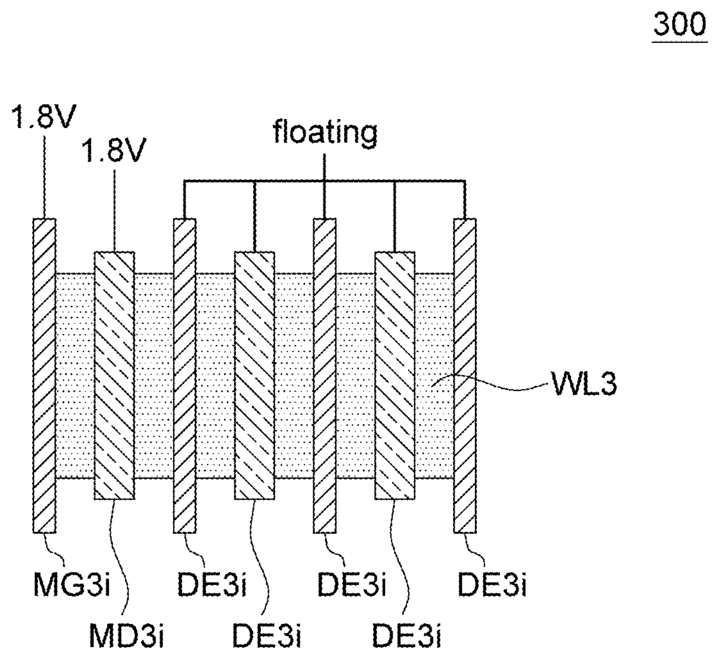
FIG. 5 shows a top view of a semiconductor structure according to another embodiment of the present disclosure.
Figure 6:
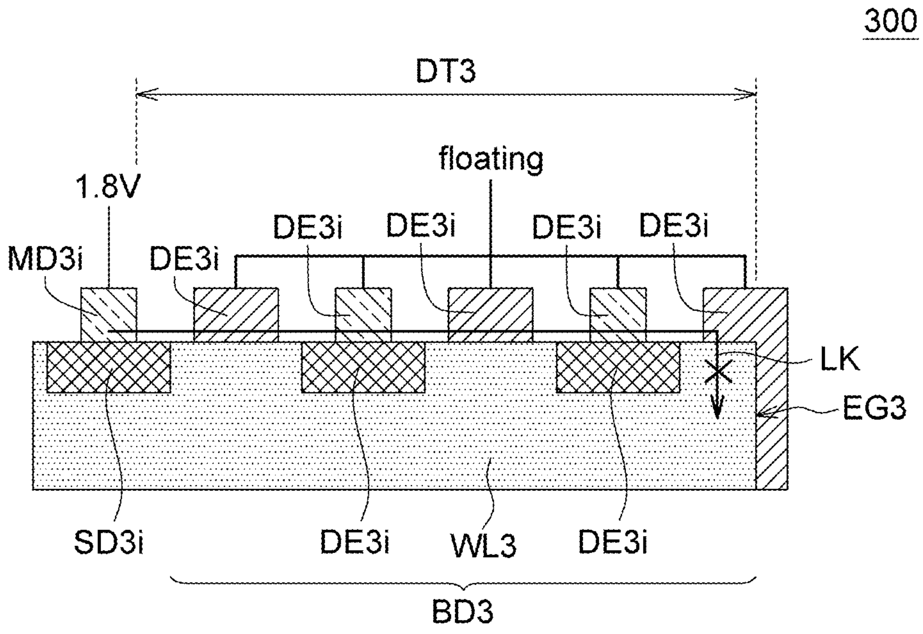
FIG. 6 shows a side view of the semiconductor structure according to one embodiment of the present disclosure.

Please refer to FIGS. 5 and 6. FIG. 5 shows a top view of a semiconductor structure 300 according to one embodiment of the present disclosure. FIG. 6 shows a side view of the semiconductor structure 300 according to one embodiment of the present disclosure. The semiconductor structure 300 includes, for example, a well WL3, a plurality of dummy elements DE3$i$, at least one source/drain diffusion region SD3$i$, at least one metal-to-diffusion layer MD3$i$ and at least one metal gate layer MG3$i$.

The well WL3 may include the same semiconductor material(s) as the substrate. The well WL3 may be doped with p-type dopants, such as boron, indium, other p-type dopant, or combinations thereof, configured for the NMOS NMS. The well WL3 may be doped with n-type dopants, such as phosphorus, arsenic, other n-type dopant, or combinations thereof. In some implementations, the well WL3 is formed with a combination of p-type dopants and n-type dopants but with a net effect of being n-type doped. In some implementations, the well WL3 is formed with a combination of p-type dopants and n-type dopants but with a net effect of being p-type doped. The various doped regions can be formed directly on and/or in the substrate, by an ion implantation process, a diffusion process, and/or other suitable doping process. The dopant concentration in the well WL3 may be in a range of about 1E16 atom/cm^3 to about 1E19 atom/cm^3 in some embodiments, depending on well resistance requirements.

The plurality dummy elements DE3$i$ are formed in or on a border area BD3 of the well WL3. The plurality dummy elements DE3$i$ include, for example, two source/drain diffusion regions, two metal-to-diffusion layers and three metal gate layers.

The source/drain diffusion region SD3$i$ is formed in the well WL3 and located at outside of the border area BD3 of the well WL3. For example, the epi material may be SiGe with Boron doped, SiGeC within Boron doped, Ge with Boron doped, Si with Boron doped, the like or the combination thereof. The Boron doping concentration of the source/drain diffusion regions SD3$i$ is within a range of 1E19/cm^3 to 6E20/cm^3.

The metal-to-diffusion layer MD3$i$ is disposed on the source/drain diffusion region SD3$i$ and located at outside of the border area BD3 of the well WL3. The material of each of the metal-to-diffusion layers MD3$i$ comprises single metal material or multiple metal layers. The material of the metal-to-diffusion layers MD3$i$ is Titanium (Ti), titanium nitride (TiN), Platinum (Pt), W (tungsten), Cobalt (Co), Ruthenium (Ru), Tungsten (W), Iridium (Ir), Rhodium (Rh), Tantalum nitride (TaN), Copper (Cu), the like, or the combination thereof.

The metal gate layer MG3$i$ is disposed adjacent to the metal-to-diffusion layer MD3$i$ and located at outside of the border area BD3 of the well WL3. The material of the metal gate layers MG3$i$ comprises single metal material or multiple metal layers. The material of the metal gate layers MG3$i$ is Titanium (Ti), titanium nitride (TiN), Platinum (Pt), W (tungsten), Cobalt (Co), Ruthenium (Ru), Tungsten (W), Iridium (Ir), Rhodium (Rh), Tantalum nitride (TaN), Copper (Cu), the like, or the combination thereof.

The plurality of dummy elements DE3$i$ are floating. In typical usage of 2 nm technology diode, the supply voltage applied to the metal gate layers MG3$i$ and the metal-to-diffusion layer MD3$i$ is 0.75 V. However, in the present embodiment shown in the FIGS. 5 and 6, the metal gate layers MG3$i$ and the metal-to-diffusion layer MD3$i$ could be applied 1.8 V. Because the 1.8 V signal is blocked by four dummy elements DE3*i* to the well WL3, high voltage, ex. 1.8 V, applied on the semiconductor structure 300 will not cause any current leak LK.

As shown in the FIGS. 5 and 6, a distance DT3 between the metal-to-diffusion layer MD3*i* and an edge EG3 of the well WL3 is larger than 86 nm.

The dummy elements DE3*i* could be floating independently. Or, the dummy elements DE3*i* could be connected together via inner routings.

Based on the embodiment shown in the FIGS. 5 and 6, the supply voltage could be higher than 0.75V in 2 nm or above technology. For example, even if the supply voltage is 1.8 V, the 1.8 V signal is blocked by the four dummy elements DE3*i* to the well WL2, and the high voltage, ex. 1.8 V, applied on the metal gate layer MG3*i* and/or the metal-to-diffusion layer MD3*i* will not cause any current leak LK.

Figure 7:
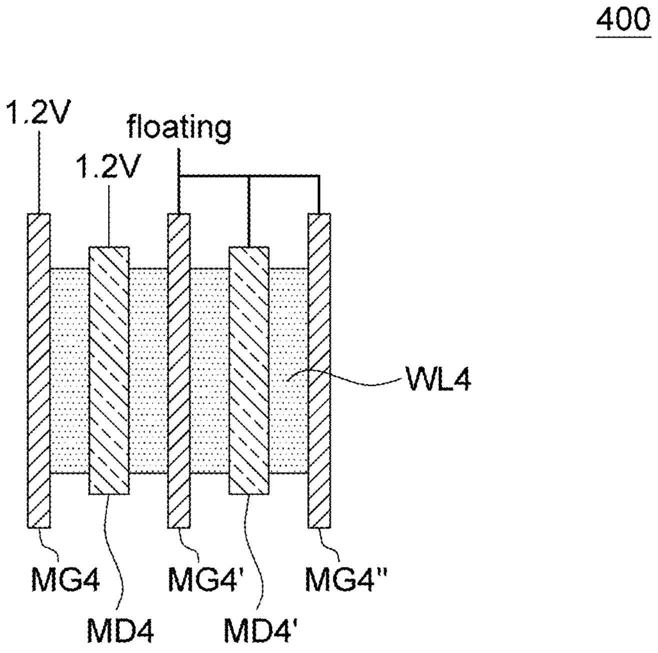
FIG. 7 shows a top view of a semiconductor structure according to another embodiment of the present disclosure.
Figure 8:
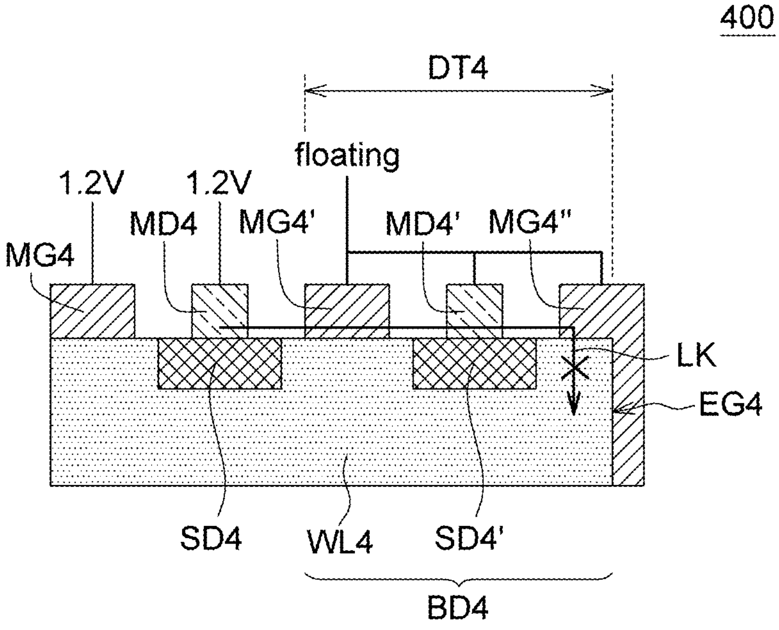
FIG. 8 shows a side view of the semiconductor structure according to another embodiment of the present disclosure.

Please refer to FIGS. 7 and 8. FIG. 7 shows a top view of a semiconductor structure 400 according to one embodiment of the present disclosure. FIG. 8 shows a side view of the semiconductor structure 400 according to one embodiment of the present disclosure. The semiconductor structure 400 includes, for example, a well WL4, an edge metal gate layer MG4", one dummy source/drain diffusion regions SD4', one dummy metal gate layers MG4', one dummy metal-to-diffusion layer MD4', at least one working source/drain diffusion region SD4, at least one working metal-to-diffusion layer MD4 and at least one working metal gate layer MG4.

The well WL4 may include the same semiconductor material(s) as the substrate. The well WL4 may be doped with p-type dopants, such as boron, indium, other p-type dopant, or combinations thereof, configured for the NMOS NMS. The well WL4 may be doped with n-type dopants, such as phosphorus, arsenic, other n-type dopant, or combinations thereof. In some implementations, the well WL4 is formed with a combination of p-type dopants and n-type dopants but with a net effect of being n-type doped. In some implementations, the well WL4 is formed with a combination of p-type dopants and n-type dopants but with a net effect of being p-type doped. The various doped regions can be formed directly on and/or in the substrate, by an ion implantation process, a diffusion process, and/or other suitable doping process. The dopant concentration in the well WL4 may be in a range of about 1E16 atom/cm^3 to about 1E19 atom/cm^3 in some embodiments, depending on well resistance requirements.

The edge metal gate layer MG4" is disposed at an edge EG4 of the well WL4. The material of the edge metal gate layer MG4" comprises single metal material or multiple metal layers. The material of the edge metal gate layer MG4" is Titanium (Ti), titanium nitride (TiN), Platinum (Pt), W (tungsten), Cobalt (Co), Ruthenium (Ru), Tungsten (W), Iridium (Ir), Rhodium (Rh), Tantalum nitride (TaN), Copper (Cu), the like, or the combination thereof.

The two dummy source/drain diffusion region SD4' is formed in a border area BD4 of the well WL4. The source/drain diffusion region SD4' includes epi profile. For example, the epi material may be SiGe with Boron doped, SiGeC within Boron doped, Ge with Boron doped, Si with Boron doped, the like or the combination thereof. The Boron doping concentration of the source/drain diffusion region SD4 is within a range of 1E19/cm^3 to 6E20/cm^3.

The dummy metal gate layer MG4' is formed on the border area BD4 of the well WL4. The material of each of the dummy metal gate layer MG4' comprises single metal material or multiple metal layers. The material of the dummy metal gate layer MG4' is Titanium (Ti), titanium nitride (TiN), Platinum (Pt), W (tungsten), Cobalt (Co), Ruthenium (Ru), Tungsten (W), Iridium (Ir), Rhodium (Rh), Tantalum nitride (TaN), Copper (Cu), the like, or the combination thereof.

The dummy metal-to-diffusion layer MD4' is formed on the dummy source/drain diffusion region SD4' and located on the border area BD4' of the well WL4. The material of the dummy metal-to-diffusion layer MD4' comprises single metal material or multiple metal layers. The material of the dummy metal-to-diffusion layer MD4' is Titanium (Ti), titanium nitride (TiN), Platinum (Pt), W (tungsten), Cobalt (Co), Ruthenium (Ru), Tungsten (W), Iridium (Ir), Rhodium (Rh), Tantalum nitride (TaN), Copper (Cu), the like, or the combination thereof.

The working source/drain diffusion region SD4 is formed in the well WL4 and located at outside of the border area BD4 of the well WL4. The working source/drain diffusion regions SD4 includes epi profile. For example, the epi material may be SiGe with Boron doped, SiGeC within Boron doped, Ge with Boron doped, Si with Boron doped, the like or the combination thereof. The Boron doping concentration of the source/drain diffusion regions SD4 is within a range of 1E19/cm^3 to 6E20/cm^3.

The working metal-to-diffusion layer MD4 is disposed on the working source/drain diffusion region SD4 and located at outside of the border area BD4 of the well WL4. The material of the working metal-to-diffusion layer MD4 comprises single metal material or multiple metal layers. The material of the working metal-to-diffusion layer MD4 is Titanium (Ti), titanium nitride (TiN), Platinum (Pt), W (tungsten), Cobalt (Co), Ruthenium (Ru), Tungsten (W), Iridium (Ir), Rhodium (Rh), Tantalum nitride (TaN), Copper (Cu), the like, or the combination thereof.

The working metal gate layer MG4 is disposed adjacent to the working metal-to-diffusion layer MD4 and located at outside of the border area BD4 of the well WL4. The material of the working metal gate layer MG4 comprises single metal material or multiple metal layers. The material of the working metal gate layer MG4 is Titanium (Ti), titanium nitride (TiN), Platinum (Pt), W (tungsten), Cobalt (Co), Ruthenium (Ru), Tungsten (W), Iridium (Ir), Rhodium (Rh), Tantalum nitride (TaN), Copper (Cu), the like, or the combination thereof.

The edge metal gate layer MG4", the dummy metal gate layer MG4' and the dummy metal-to-diffusion layer MD4' are floating.

In typical usage of 2 nm technology diode, the supply voltage applied on the working metal gate layer MG4 and the working metal-to-diffusion layer MD4 is 0.75 V. However, in the present embodiment shown in the FIGS. 7 and 8, the working metal gate layer MG4 and the working metal-to-diffusion layers MD4 could be applied 1.2 V. Because the 1.2 V signal is blocked by the dummy metal gate layer MG4' and the dummy metal-to-diffusion layers MD4' to the well WL4, high voltage, ex. 1.2 V, applied on the working metal gate layer MG4 and/or the working metal-to-diffusion layer MD4 will not cause a current leak LK.

As shown in the FIGS. 7 and 8, a distance DT4 between the metal-to-diffusion layer MD4 applied 1.2 V and the edge EG4 of the well WL4 is one contacted poly pitch (CPP). In one embodiment, the distance DT4 between the working metal-to-diffusion layer MD4 and the edge metal gate layer MG4" is, for example, larger than 43 nm.

The dummy metal-to-diffusion layer MD4' could be floating independently. The edge metal gate layer MG4" and the dummy metal gate layer MG4' could be floating independently. Or, the edge metal gate layer MG4" and the dummy metal gate layer MG4' could be connected together via inner routings. Or, the dummy metal-to-diffusion layer MD4', the edge metal gate layer MG4" and the dummy metal gate layer MG4' could be connected together via inner routings.

Based on the embodiment shown in the FIGS. 7 and 8, the supply voltage could be higher than 0.75V in 2 nm or above technology. For example, even if the supply voltage is 1.2 V, the 1.2 V signal is blocked by the dummy metal gate layer MG4' and the dummy metal-to-diffusion layers MD4' to the well WL4, and the high voltage, ex. 1.2 V, applied on the working metal gate layer MG4 and/or the working metal-to-diffusion layer MD4 will not cause any current leak LK.

Figure 9:
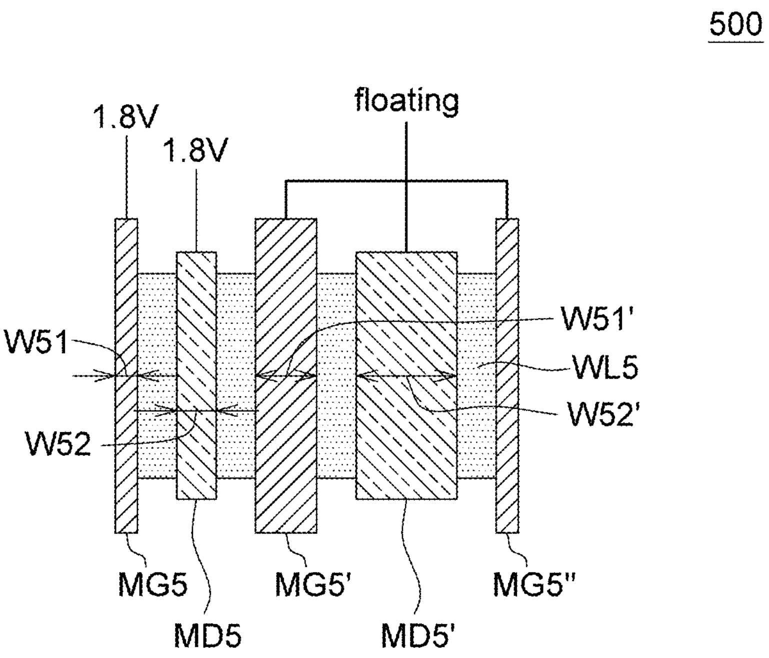
FIG. 9 shows a top view of a semiconductor structure according to another embodiment of the present disclosure.
Figure 10:
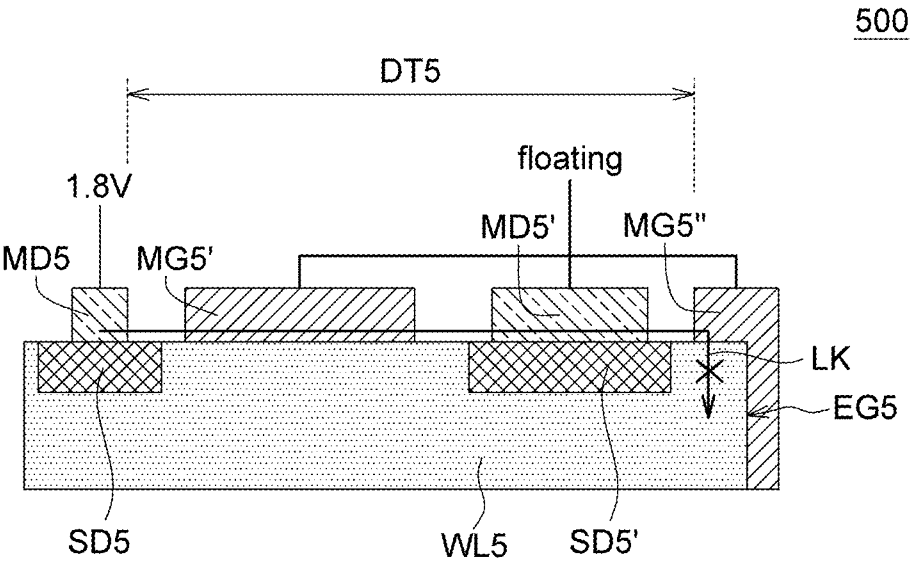
FIG. 10 shows a side view of the semiconductor structure according to one embodiment of the present disclosure.

Please refer to FIGS. 9 and 10. FIG. 9 shows a top view of a semiconductor structure 500 according to one embodiment of the present disclosure. FIG. 10 shows a side view of the semiconductor structure 500 according to one embodiment of the present disclosure. The semiconductor structure 500 includes, for example, a well WL5, an edge metal gate layer MG5", one dummy source/drain diffusion regions SD5', one dummy metal gate layers MG5', one dummy metal-to-diffusion layer MD5', at least one working source/drain diffusion region SD5, at least one working metal-to-diffusion layer MD5 and at least one working metal gate layer MG5.

The well WL5 may include the same semiconductor material(s) as the substrate. The well WL5 may be doped with p-type dopants, such as boron, indium, other p-type dopant, or combinations thereof, configured for the NMOS NMS. The well WL5 may be doped with n-type dopants, such as phosphorus, arsenic, other n-type dopant, or combinations thereof. In some implementations, the well WL5 is formed with a combination of p-type dopants and n-type dopants but with a net effect of being n-type doped. In some implementations, the well WL5 is formed with a combination of p-type dopants and n-type dopants but with a net effect of being p-type doped. The various doped regions can be formed directly on and/or in the substrate, by an ion implantation process, a diffusion process, and/or other suitable doping process. The dopant concentration in the well WL5 may be in a range of about 1E16 atom/cm^3 to about 1E19 atom/cm^3 in some embodiments, depending on well resistance requirements.

The edge metal gate layer MG5" is disposed at an edge EG5 of the well WL5. The material of the edge metal gate layer MG5" comprises single metal material or multiple metal layers. The material of the edge metal gate layer MG5" is Titanium (Ti), titanium nitride (TiN), Platinum (Pt), W (tungsten), Cobalt (Co), Ruthenium (Ru), Tungsten (W), Iridium (Ir), Rhodium (Rh), Tantalum nitride (TaN), Copper (Cu), the like, or the combination thereof.

The two dummy source/drain diffusion region SD5' is formed in a border area BD5 of the well WL5. The source/drain diffusion region SD5' includes epi profile. For example, the epi material may be SiGe with Boron doped, SiGeC within Boron doped, Ge with Boron doped, Si with Boron doped, the like or the combination thereof. The Boron doping concentration of the source/drain diffusion region SD5 is within a range of 1E19/cm^3 to 6E20/cm^3.

The dummy metal gate layer MG5' is formed on the border area BD5 of the well WL5. The material of each of the dummy metal gate layer MG5' comprises single metal material or multiple metal layers. The material of the dummy metal gate layer MG5' is Titanium (Ti), titanium nitride (TiN), Platinum (Pt), W (tungsten), Cobalt (Co), Ruthenium (Ru), Tungsten (W), Iridium (Ir), Rhodium (Rh), Tantalum nitride (TaN), Copper (Cu), the like, or the combination thereof.

The dummy metal-to-diffusion layer MD5' is formed on the dummy source/drain diffusion region SD5' and located on the border area BD5' of the well WL5. The material of the dummy metal-to-diffusion layer MD5' comprises single metal material or multiple metal layers. The material of the dummy metal-to-diffusion layer MD5' is Titanium (Ti), titanium nitride (TiN), Platinum (Pt), W (tungsten), Cobalt (Co), Ruthenium (Ru), Tungsten (W), Iridium (Ir), Rhodium (Rh), Tantalum nitride (TaN), Copper (Cu), the like, or the combination thereof.

The working source/drain diffusion region SD5 is formed in the well WL5 and located at outside of the border area BD5 of the well WL5. The working source/drain diffusion regions SD5 includes epi profile. For example, the epi material may be SiGe with Boron doped, SiGeC within Boron doped, Ge with Boron doped, Si with Boron doped, the like or the combination thereof. The Boron doping concentration of the source/drain diffusion regions SD5 is within a range of 1E19/cm^3 to 6E20/cm^3.

The working metal-to-diffusion layer MD5 is disposed on the working source/drain diffusion region SD5 and located at outside of the border area BD5 of the well WL5. The material of the working metal-to-diffusion layer MD5 comprises single metal material or multiple metal layers. The material of the working metal-to-diffusion layer MD5 is Titanium (Ti), titanium nitride (TiN), Platinum (Pt), W (tungsten), Cobalt (Co), Ruthenium (Ru), Tungsten (W), Iridium (Ir), Rhodium (Rh), Tantalum nitride (TaN), Copper (Cu), the like, or the combination thereof.

The working metal gate layer MG5 is disposed adjacent to the working metal-to-diffusion layer MD5 and located at outside of the border area BD5 of the well WL5. The material of the working metal gate layer MG5 comprises single metal material or multiple metal layers. The material of the working metal gate layer MG5 is Titanium (Ti), titanium nitride (TiN), Platinum (Pt), W (tungsten), Cobalt (Co), Ruthenium (Ru), Tungsten (W), Iridium (Ir), Rhodium (Rh), Tantalum nitride (TaN), Copper (Cu), the like, or the combination thereof.

The edge metal gate layer MG5", the dummy metal gate layer MG5' and the dummy metal-to-diffusion (MD) layer MD5' are floating.

The width W51' of the dummy metal gate layer MG5' is larger than the width W51 of the working metal gate layer MG5. For example, the width W51' of the dummy metal gate layer MG5' is twice as the width W51 of the working metal gate layer MG5. The width W52' of the dummy metal-to-diffusion layer MD5' is larger than the width W52 of the working metal-to-diffusion layer MD5. For example, the width W52' of the dummy metal-to-diffusion layer MD5' is twice as the width W52 of the working metal-to-diffusion layer MD5.

In typical usage of 2 nm technology diode, the supply voltage applied on the working metal gate layer MG5 and the working metal-to-diffusion layer MD4 is 0.75 V. However, in the present embodiment shown in the FIGS. 9 and 10, the working metal gate layer MG5 and the working metal-to-diffusion layers MD5 could be applied 1.8 V. Because the 1.8 V signal is blocked by the dummy metal gate layer MG5' and the dummy metal-to-diffusion layers MD5' to the well WL5, high voltage, ex. 1.8 V, applied on the working metal gate layer MG5 and/or the working metal-to-diffusion layer MD5 will not cause a current leak LK.

As shown in the FIGS. 9 and 10, a distance DT5 between the metal-to-diffusion layer MD5 applied 1.8 V and the edge EG5 of the well WL5 is larger than 86 nm.

The dummy metal-to-diffusion layer MD5' could be floating independently. The edge metal gate layer MG5" and the dummy metal gate layer MG5' could be floating independently. Or, the edge metal gate layer MG5" and the dummy metal gate layers MG5' could be connected together via inner routings. Or, the dummy metal-to-diffusion layer MD5', the edge metal gate layer MG5" and the dummy metal gate layer MG5' could be connected together via inner routings.

Based on the embodiment shown in the FIGS. 9 and 10, the supply voltage could be higher than 0.75V in 2 nm or above technology. For example, even if the supply voltage is 1.8 V, the 1.8 V signal is blocked by the dummy metal gate layer MG5' and the dummy metal-to-diffusion layers MD5' to the well WL5, and the high voltage, ex. 1.8 V, applied on the working metal gate layer MG8 and/or the working metal-to-diffusion layer MD8 will not cause any current leak LK.

Please refer to FIGS. 11A to 11I, which illustrate a manufacturing method of the semiconductor structure 100 according to one embodiment of the present disclosure. As shown in the FIG. 11A, the well WL1 is formed.

Figure 11A:
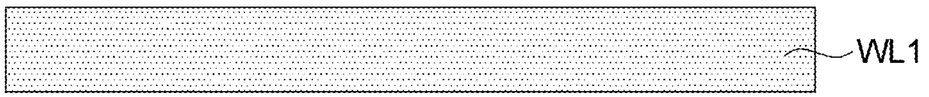
FIGS. 11A to 11I illustrate a manufacturing method of the semiconductor structure according to one embodiment of the present disclosure.
Figure 11B:
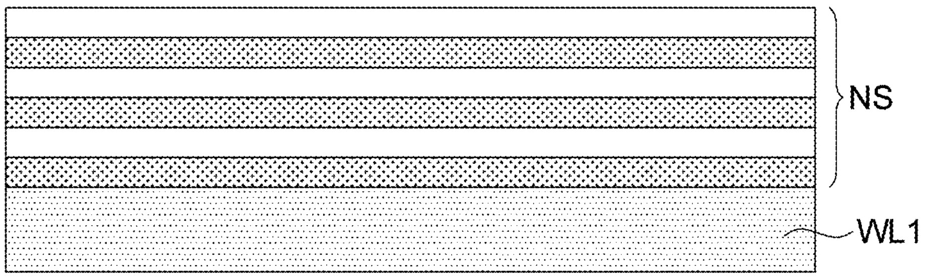

Then, as shown in the FIG. 11B, a nanosheet structure NS is formed on the well WL1.

Figure 11C:
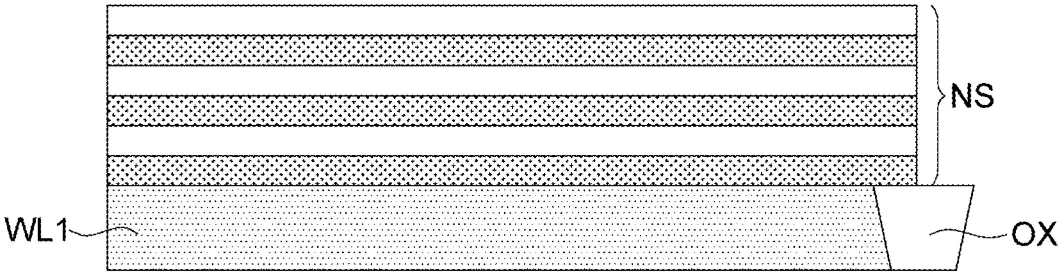

Next, as shown in the FIG. 11C, a shallow trench isolation (STI) OX is formed in the well WL1.

Figure 11D:
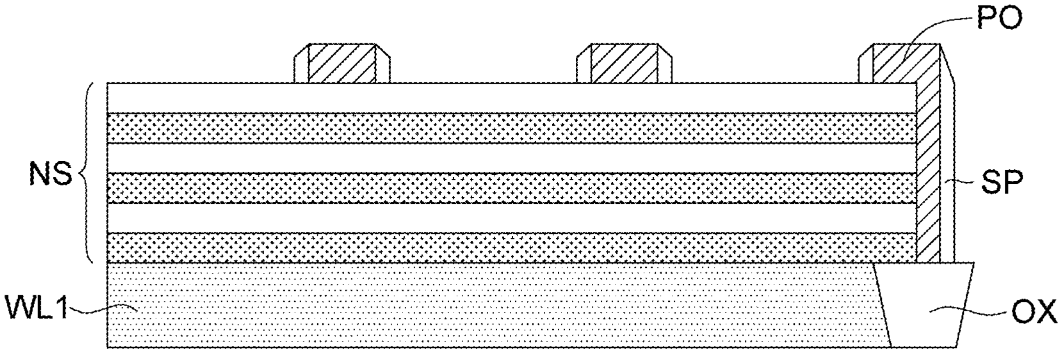

Afterward, as shown in the FIG. 11D, poly layers PO and spacers SP are formed on the nanosheet structure NS, on the edge of the nanosheet structure NS and on the STI OX.

Figure 11E:
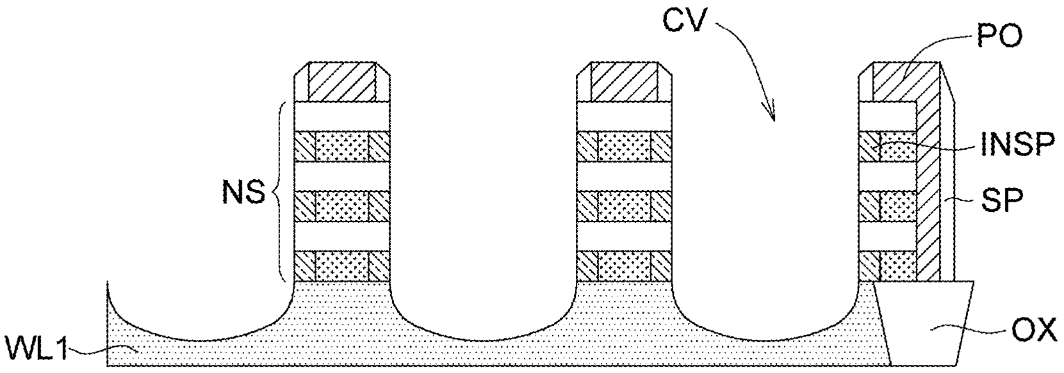

Then, as shown in the FIG. 11E, the nanosheet structure NS and the well WL1 are etched to form a plurality of concaves CV, and a plurality of inner spacers INSP are formed at the sides of the nanosheet structure NS.

Figure 11F:
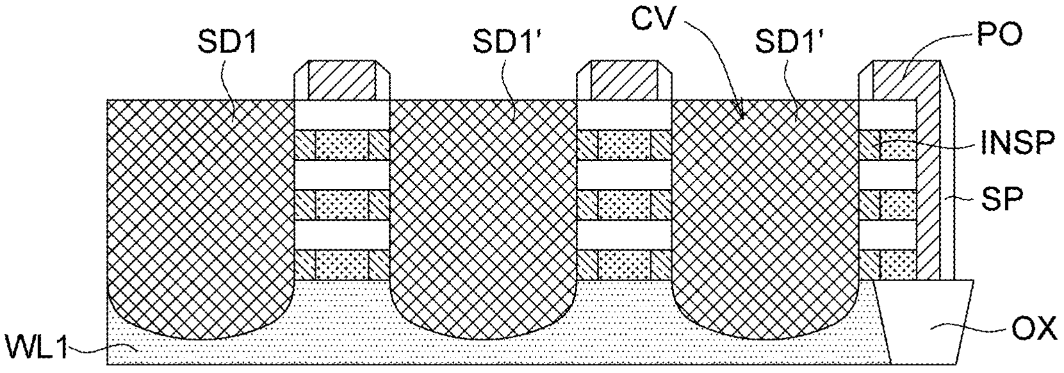

Next, as shown in the FIG. 11F, the concaves CV are filled N-type epi-layers and P-type epi-layers to form the working source/drain diffusion region SD1 and the dummy source/drain diffusion regions SD1'.

Figure 11G:
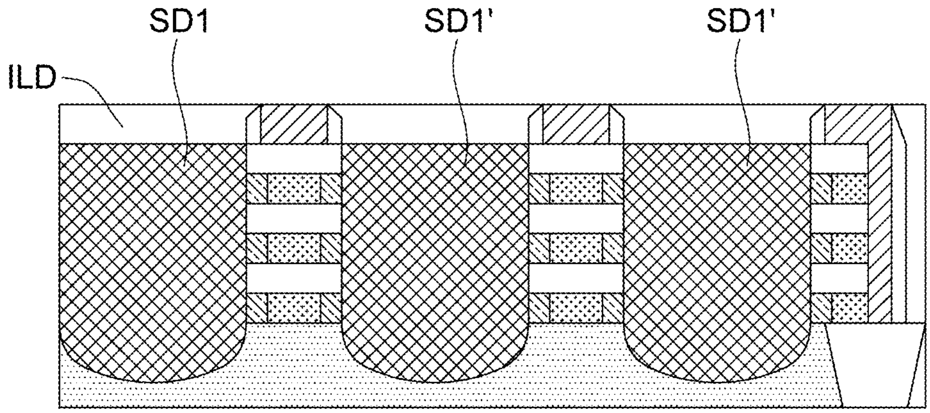

Afterwards, as shown in the FIG. 11G, an interlayer dielectric layer ILD is formed.

Figure 11H:
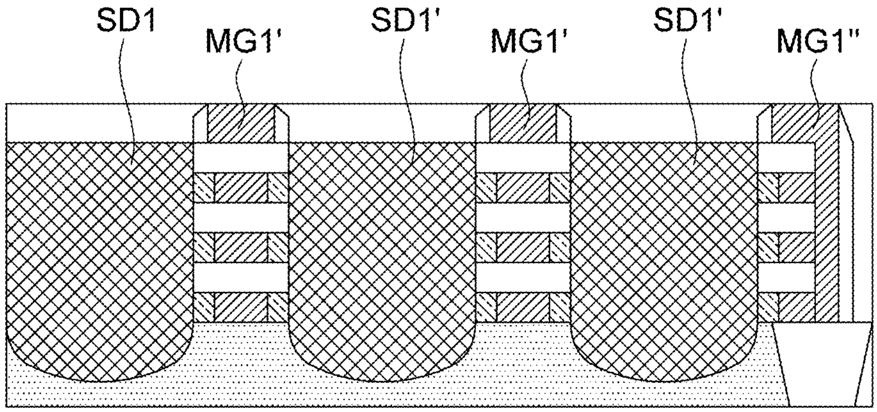

Then, as shown in the FIG. 11H, the dummy metal gate layers MG1' and the edge metal gate layer MG1" are formed.

Figure 11I:
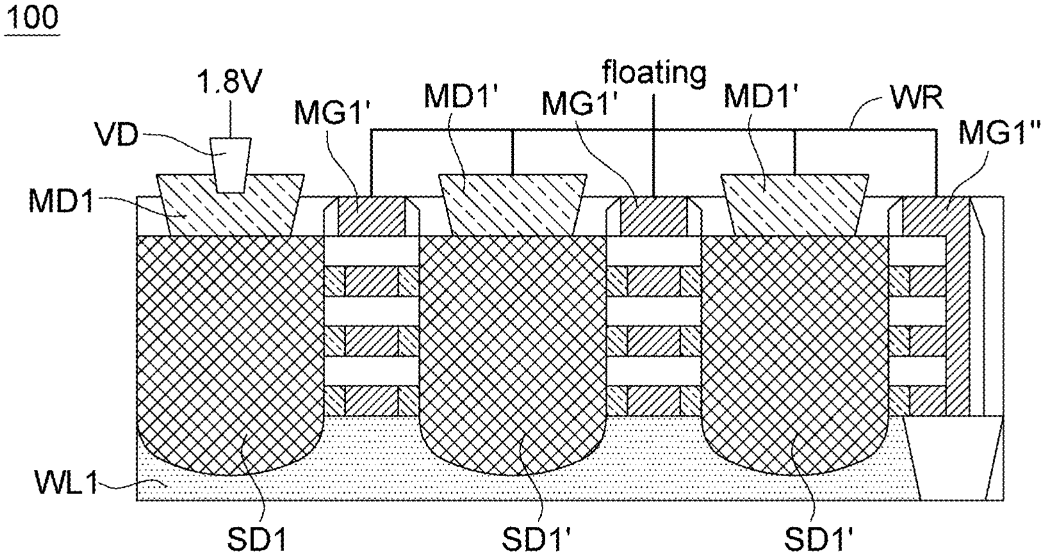

Next, as shown in the FIG. 11I, the working metal-to-diffusion layers MD1 and the dummy metal-to-diffusion layers MD1' are formed on the working source/drain diffusion region SD1 and the dummy source/drain diffusion regions SD1'. Then, the floating wires WR connected the edge metal gate layer MG1", the two dummy metal gate layers MG1' and the two dummy metal-to-diffusion layers MD1' are formed.

According to FIGS. 11A to 11I, the two dummy source/drain diffusion regions SD1' are formed in the border area BD1 (shown in the FIG. 2) of the well WL1, the two dummy metal gate layers MG1' are formed on the border area BD1 of the well WL1, and the at least one working metal-to-diffusion layer MD1 is disposed on the working source/drain diffusion region SD1 and located at outside of the border area BD1 of the well WL1.

In this disclosure, at least the following example embodiments are disclosed.

According to one example embodiment, a semiconductor structure is provided. The semiconductor structure includes a well, an edge metal gate (MG) layer, two dummy source/drain diffusion regions, two dummy metal gate layers, two dummy metal-to-diffusion (MD) layers, at least one working source/drain diffusion region, at least one working metal-to-diffusion layer and at least one working metal gate layer. The edge metal gate layer is disposed at an edge of the well. The two dummy source/drain diffusion regions are formed in a border area of the well. The two dummy metal gate layers are formed on the border area of the well. The two dummy metal-to-diffusion layers are respectively formed on the dummy source/drain diffusion regions and located on the border area of the well. The at least one working source/drain diffusion region is formed in the well and located at outside of the border area of the well. The at least one working metal-to-diffusion layer is disposed on the working source/drain diffusion region and located at outside of the border area of the well. The at least one working metal gate layer is disposed adjacent to the working metal-to-diffusion layer and located at outside of the border area of the well. The edge metal gate layer, the two dummy metal gate layers and the two dummy metal-to-diffusion layers are floating.

Based on the semiconductor structure described in the previous embodiments, the working metal gate layer and the working metal-to-diffusion layers are applied 1.8 V.

Based on the semiconductor structure described in the previous embodiments, a distance between the working metal-to-diffusion layer and the edge metal gate layer is larger than 86 nm.

Based on the semiconductor structure described in the previous embodiments, the dummy metal-to-diffusion layers are connected together.

Based on the semiconductor structure described in the previous embodiments, the edge metal gate layer and the dummy metal gate layers are connected together.

Based on the semiconductor structure described in the previous embodiments, the dummy metal-to-diffusion layers, the edge metal gate layer and the dummy metal gate layers are connected together.

Based on the semiconductor structure described in the previous embodiments, one of the dummy metal-to-diffusion layers is disposed between the edge metal gate layer and one of the two dummy metal gate layers, and another one of the dummy metal-to-diffusion layers is disposed between the two dummy metal gate layers.

According to one example embodiment, a manufacturing method of a semiconductor structure is provided. The manufacturing method of the semiconductor structure includes: forming a well WL1; forming a nanosheet structure on the well; forming a shallow trench isolation (STI) in the well; forming a plurality of poly layers and a plurality of spacers on the nanosheet structure, on an edge of the nanosheet structure and on the STI; etching the nanosheet structure and the well to form a plurality of concaves; forming a plurality of inner spacers at sides of the nanosheet structure; filling N-type epi-layers and P-type epi-layers in the concaves to form at least one working source/drain diffusion region and two dummy source/drain diffusion regions; forming an interlayer dielectric layer; forming two dummy metal gate layers and an edge metal gate layer; forming a least one working metal-to-diffusion layer and two dummy metal-to-diffusion layers on the working source/drain diffusion region and the dummy source/drain diffusion regions; and forming a plurality of floating wires connected the edge metal gate layer, the two dummy metal gate layers and the two dummy metal-to-diffusion layers.

Based on the manufacturing method of the semiconductor structure described in the previous embodiments, the two dummy source/drain diffusion regions are formed in a border area of the well.

Based on the manufacturing method of the semiconductor structure described in the previous embodiments, the two dummy metal gate layers are formed on the border area of the well.

Based on the manufacturing method of the semiconductor structure described in the previous embodiments, the at least one working metal-to-diffusion layer is disposed on the working source/drain diffusion region and located at outside of the border area of the well.

Based on the semiconductor structure described in the previous embodiments, a distance between the metal-to-diffusion layer applied 1.8 V and the edge of the well is two contacted poly pitches (CPP).

Based on the semiconductor structure described in the previous embodiments, a distance between the metal-to-diffusion layer applied 1.8 V and the edge of the well is larger than 86 nm.

Based on the semiconductor structure described in the previous embodiments, the metal-to-diffusion layers which are floating are connected together.

Based on the semiconductor structure described in the previous embodiments, the metal gate layers which are floating are connected together.

Based on the semiconductor structure described in the previous embodiments, the metal-to-diffusion layers and the metal gate layers which are floating are connected together.

According to one example embodiment, a semiconductor structure is provided. The semiconductor structure includes a well, a plurality dummy elements, at least one source/drain diffusion region, at least one metal-to-diffusion (MD) layer and at least one metal gate (MG) layer. The plurality dummy elements are formed in or on a border area of the well. The at least one source/drain diffusion region is formed in the well and located at outside of the border area of the well. The at least one metal-to-diffusion layer is disposed on the source/drain diffusion region and located at outside of the border area of the well. The at least one metal gate layer is disposed adjacent to the metal-to-diffusion layer and located at outside of the border area of the well. The plurality of dummy elements are floating.

Based on the semiconductor structure described in the previous embodiments, the metal gate layer and the metal-to-diffusion layers are applied 1.8 V.

Based on the semiconductor structure described in the previous embodiments, a distance between the metal-to-diffusion layer and an edge of the well WL3 is larger than 86 nm.

Based on the semiconductor structure described in the previous embodiments, the dummy elements are connected together.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:

a well;

an edge metal gate (MG) layer, disposed at an edge of the well;

two dummy source/drain diffusion regions, formed in a border area of the well;

two dummy metal gate layers, formed on the border area of the well;

two dummy metal-to-diffusion (MD) layers, respectively formed on the dummy source/drain diffusion regions and located on the border area of the well;

at least one working source/drain diffusion region, formed in the well and located at outside of the border area of the well;

at least one working metal-to-diffusion layer, disposed on the working source/drain diffusion region and located at outside of the border area of the well; and at least one working metal gate layer, disposed adjacent to the working metal-to-diffusion layer and located at outside of the border area of the well;

wherein the edge metal gate layer, the two dummy metal gate layers and the two dummy metal-to-diffusion layers are floating.

2. The semiconductor structure according to claim 1, wherein the working metal gate layer and the working metal-to-diffusion layers are applied 1.8 V.

3. The semiconductor structure according to claim 1, wherein a distance between the working metal-to-diffusion layer and the edge metal gate layer is larger than 86 nm.

4. The semiconductor structure according to claim 1, wherein the dummy metal-to-diffusion layers are connected together.

5. The semiconductor structure according to claim 1, wherein the edge metal gate layer and the dummy metal gate layers are connected together.

6. The semiconductor structure according to claim 1, wherein the dummy metal-to-diffusion layers, the edge metal gate layer and the dummy metal gate layers are connected together.

7. The semiconductor structure according to claim 1, wherein one of the dummy metal-to-diffusion layers is disposed between the edge metal gate layer and one of the two dummy metal gate layers, and another one of the dummy metal-to-diffusion layers is disposed between the two dummy metal gate layers.

8. A semiconductor structure, comprising:

a well;

a plurality of source/drain diffusion regions, formed in the well;

a plurality of metal-to-diffusion (MD) layers, wherein each of the metal-to-diffusion layers is disposed on one of the plurality of source/drain diffusion regions; and a plurality of metal gate (MG) layers, wherein one of the plurality of metal gate layers is disposed at an edge of the well, each of the metal-to-diffusion layers is disposed between two of the plurality of metal gate layers which are adjacent;

wherein some of the metal gate layers which are at or close to the edge of the well are floating, and some of the metal-to-diffusion layers which are close to the edge of the well are floating.

9. The semiconductor structure according to claim 8, wherein three of the metal gate layers which are at or close to the edge of the well are floating.

10. The semiconductor structure according to claim 8, wherein two of the metal-to-diffusion layers which are close to the edge of the well are floating.

11. The semiconductor structure according to claim 8, wherein one of the plurality of metal gate layers and one of the plurality of metal-to-diffusion layers are applied 1.8 V.

12. The semiconductor structure according to claim 11, wherein a distance between the metal-to-diffusion layer applied 1.8 V and the edge of the well is two contacted poly pitches (CPP).

13. The semiconductor structure according to claim 11, wherein a distance between the metal-to-diffusion layer applied 1.8 V and the edge of the well is larger than 86 nm.

14. The semiconductor structure according to claim 8, wherein the metal-to-diffusion layers which are floating are connected together.

15. The semiconductor structure according to claim 8, wherein the metal gate layers which are floating are connected together.

16. The semiconductor structure according to claim 8, wherein the metal-to-diffusion layers and the metal gate layers which are floating are connected together.

17. A manufacturing method of a semiconductor structure, comprising:

forming a well;

forming a nanosheet structure on the well;

forming a shallow trench isolation (STI) in the well;

forming a plurality of poly layers and a plurality of spacers on the nanosheet structure, on an edge of the nanosheet structure and on the STI;

etching the nanosheet structure and the well to form a plurality of concaves;

forming a plurality of inner spacers at sides of the nanosheet structure;

filling N-type epi-layers and P-type epi-layers in the concaves to form at least one working source/drain diffusion region and two dummy source/drain diffusion regions;

forming an interlayer dielectric layer;

forming two dummy metal gate layers and an edge metal gate layer;

forming a least one working metal-to-diffusion layer and two dummy metal-to-diffusion layers on the working source/drain diffusion region and the dummy source/drain diffusion regions; and forming a plurality of floating wires connected the edge metal gate layer, the two dummy metal gate layers and the two dummy metal-to-diffusion layers.

18. The manufacturing method of the semiconductor structure according to claim 17, wherein the two dummy source/drain diffusion regions are formed in a border area of the well.

19. The manufacturing method of the semiconductor structure according to claim 17, wherein the two dummy metal gate layers are formed on a border area of the well.

20. The manufacturing method of the semiconductor structure according to claim 17, wherein the at least one working metal-to-diffusion layer is disposed on the working source/drain diffusion region and located at outside of a border area of the well.

* * * * *